United States Patent
Lau et al.

(10) Patent No.: US 12,550,751 B2
(45) Date of Patent: Feb. 10, 2026

(54) FLIP CHIP BONDING FOR SEMICONDUCTOR PACKAGES USING METAL STRIP

(71) Applicant: Infineon Technologies AG, Neubiberg (DE)

(72) Inventors: Chew Yeek Lau, Muar (MY); Swee Kah Lee, Melaka (MY); Fong Mei Lum, Melaka (MY); Kon Hoe Chin, Pusing (MY)

(73) Assignee: Infineon Technologies AG, Neubiberg (DE)

( * ) Notice: Subject to any disclaimer, the term of this patent is extended or adjusted under 35 U.S.C. 154(b) by 490 days.

(21) Appl. No.: 18/087,377

(22) Filed: Dec. 22, 2022

(65) Prior Publication Data

US 2024/0213035 A1  Jun. 27, 2024

(51) Int. Cl.
*H01L 21/48* (2006.01)
*H01L 21/56* (2006.01)
(Continued)

(52) U.S. Cl.
CPC ...... *H01L 21/4828* (2013.01); *H01L 21/4846* (2013.01); *H01L 21/56* (2013.01); *H01L 23/3107* (2013.01); *H01L 23/49579* (2013.01); *H01L 24/13* (2013.01); *H01L 24/16* (2013.01); *H01L 24/19* (2013.01); *H01L 24/20* (2013.01); *H01L 24/81* (2013.01); *H01L 2224/13082* (2013.01); *H01L 2224/13109* (2013.01); *H01L 2224/13111* (2013.01); *H01L 2224/13116* (2013.01); *H01L 2224/13139* (2013.01); *H01L 2224/13147* (2013.01);
(Continued)

(58) Field of Classification Search
CPC ............. H01L 21/56; H01L 23/3107; H01L 2223/54426; H01L 24/16; H01L 24/19; H01L 24/56; H01L 24/81; H01L 24/13; H01L 2224/16503
See application file for complete search history.

(56) References Cited

U.S. PATENT DOCUMENTS 8,704,345 B2 * 4/2014 Kuo ............... H01L 21/4828
257/673
2010/0144152 A1 * 6/2010 Park ................ H01L 21/568
438/689
(Continued)

FOREIGN PATENT DOCUMENTS

DE  102009038702 A1  4/2010
JP  2021150343 A  9/2021

*Primary Examiner* — Khiem D Nguyen
(74) *Attorney, Agent, or Firm* — Murphy, Bilak & Homiller, PLLC

(57) ABSTRACT

A method of forming one or more semiconductor packages includes mounting one or more semiconductor dies on the metal strip such that the one or more semiconductor dies are in a flip chip arrangement whereby terminals of the one or more semiconductor dies face the upper surface of the metal strip, forming an electrically insulating encapsulant material on the upper surface of the metal strip that encapsulates the one or more semiconductor dies, and forming package terminals that are electrically connected with the terminals of the one or more semiconductor dies, wherein the package terminals are formed from the metal strip or from metal that is deposited after removing the metal strip.

11 Claims, 12 Drawing Sheets

(51) Int. Cl.
  *H01L 23/00* (2006.01)
  *H01L 23/31* (2006.01)
  *H01L 23/495* (2006.01)

(52) U.S. Cl.
  CPC ............... *H01L 2224/16245* (2013.01); *H01L 2224/16503* (2013.01); *H01L 2224/19* (2013.01); *H01L 2224/214* (2013.01); *H01L 2224/81132* (2013.01); *H01L 2224/81191* (2013.01); *H01L 2224/8181* (2013.01)

(56) References Cited

U.S. PATENT DOCUMENTS

| | | | |
|---|---|---|---|
| 2012/0309130 A1* | 12/2012 | Hin | H01L 21/568 |
| | | | 257/E21.599 |
| 2016/0043020 A1* | 2/2016 | Xia | H01L 21/56 |
| | | | 257/676 |
| 2017/0213941 A1* | 7/2017 | Ikegami | H10H 20/8516 |
| 2018/0190608 A1* | 7/2018 | Gupta | H01L 23/49503 |
| 2020/0020649 A1* | 1/2020 | Myers | H01L 21/565 |
| 2021/0111108 A1* | 4/2021 | Singer | H01L 23/49524 |
| 2021/0366732 A1 | 11/2021 | Chiang et al. | |
| 2022/0210911 A1 | 6/2022 | Luo et al. | |

\* cited by examiner

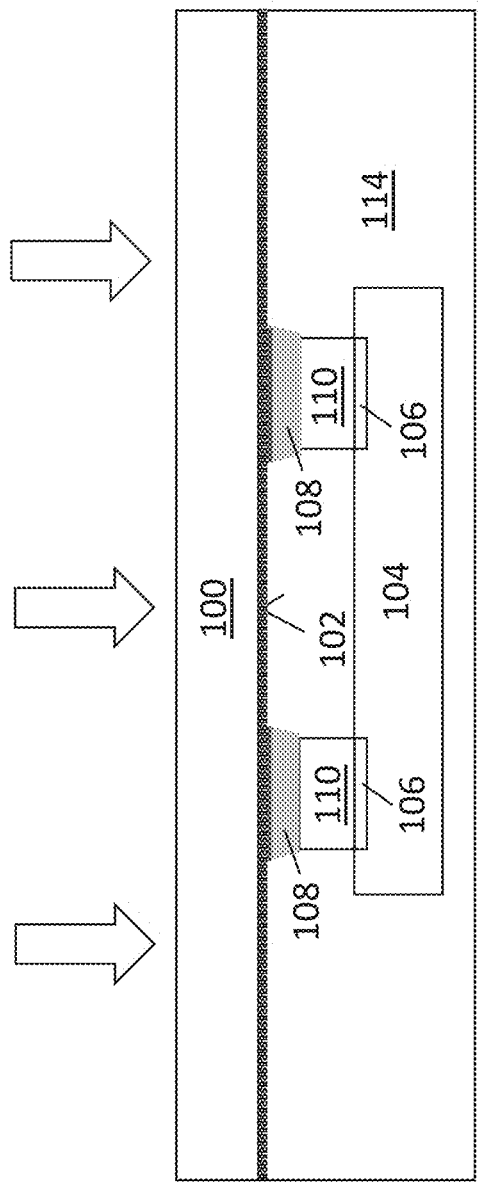
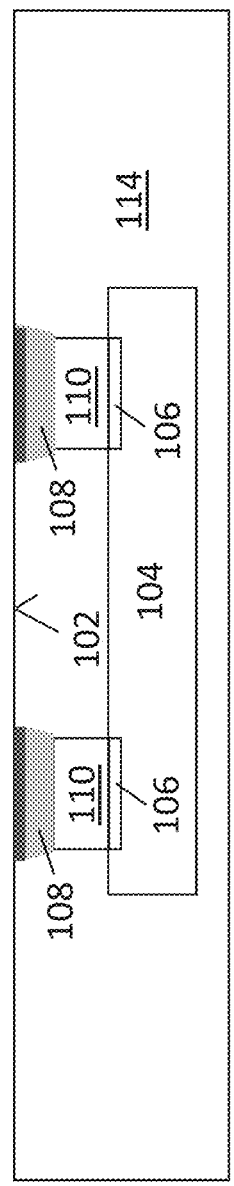

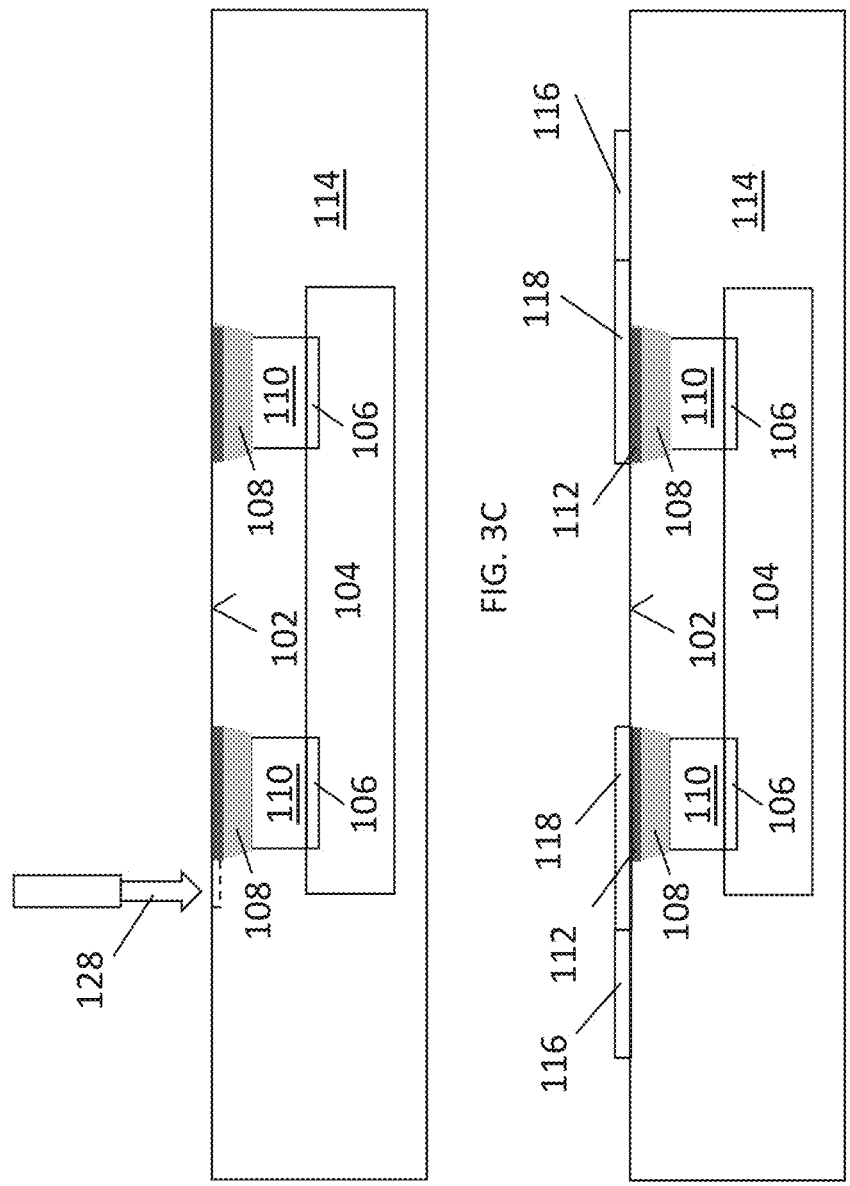

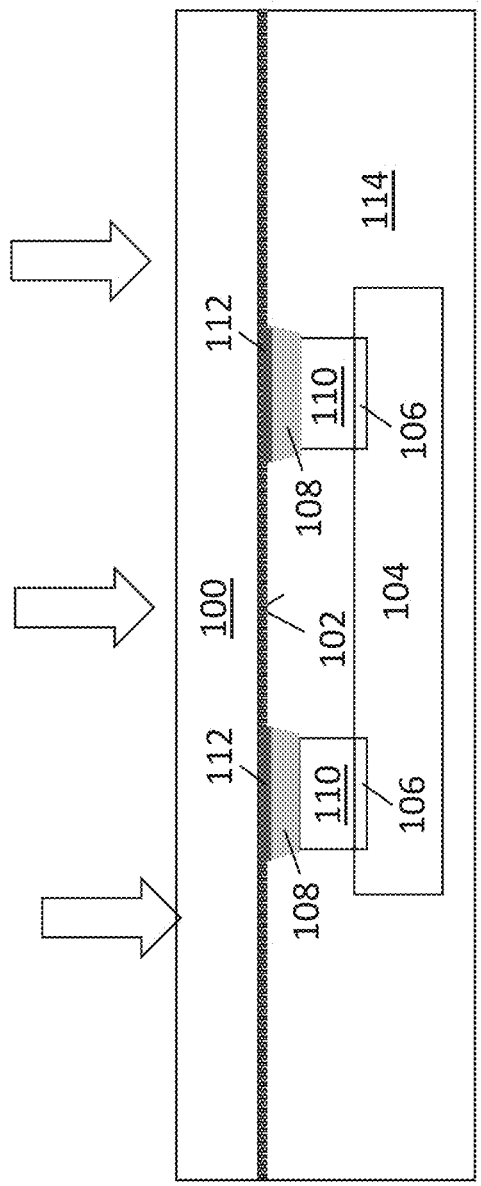
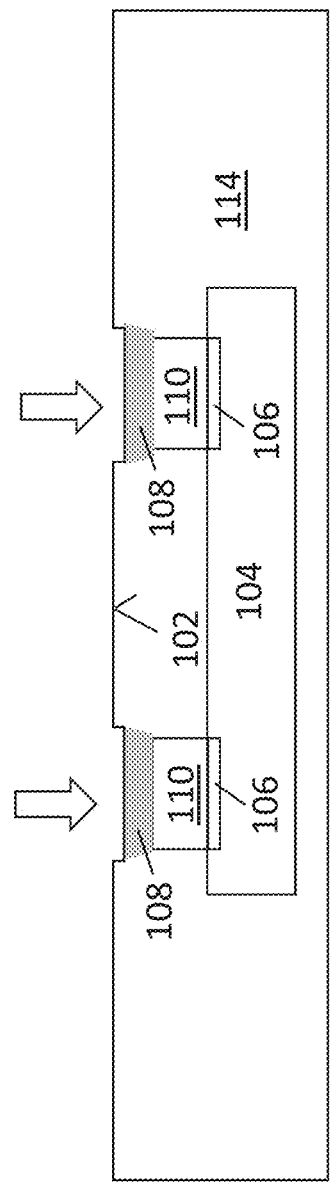
FIG. 4A
FIG. 4B

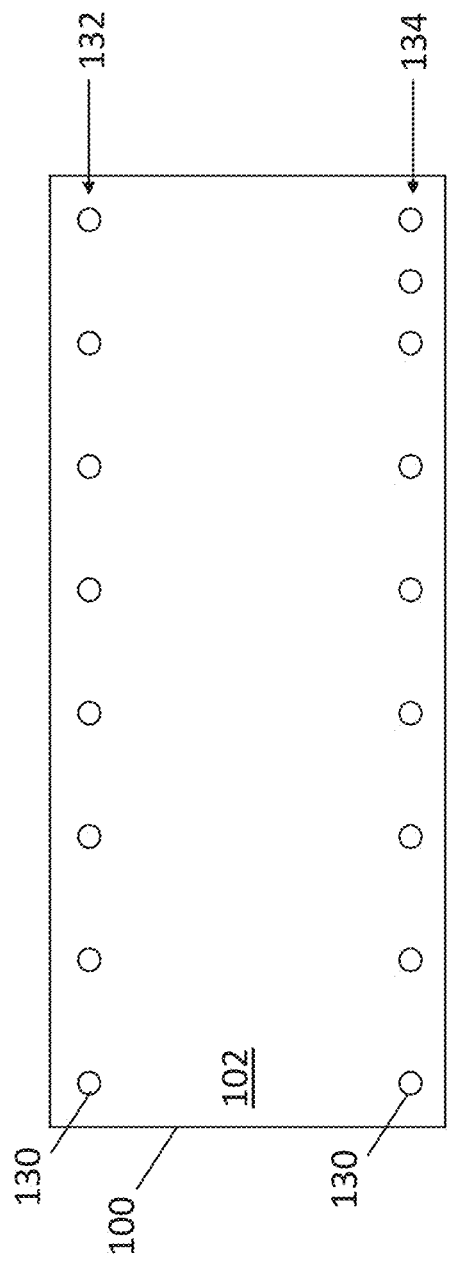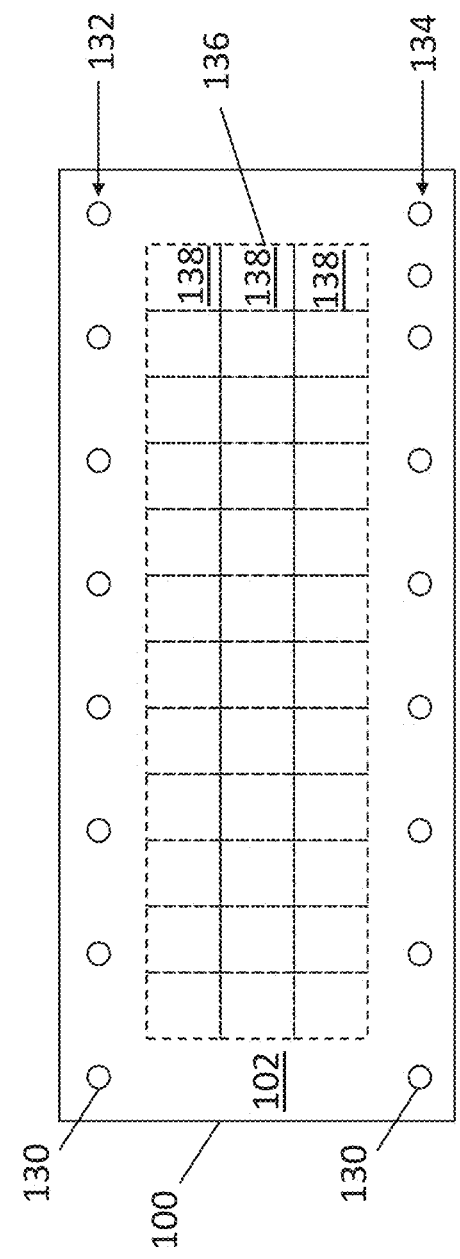

FLIP CHIP BONDING FOR SEMICONDUCTOR PACKAGES USING METAL STRIP

TECHNICAL FIELD

The instant application relates to semiconductor devices, and in particular relates to methods of forming semiconductor packages and corresponding semiconductor packages.

BACKGROUND

Many types of semiconductor devices are highly sensitive to parasitic electrical effects such as parasitic interconnect resistance and inductance, parasitic capacitive coupling, etc. For example, switches, RF (radio frequency) power amplifiers, low-noise amplifiers (LNAs), antenna tuners, mixers, etc. are each highly sensitive to parasitic electrical effects. Techniques for reducing parasitic electrical effects on a packaged semiconductor device often result in higher overall cost, larger package size, more complex manufacturing process, reduced device performance, etc.

SUMMARY

A method of forming one or more semiconductor packages is disclosed. According to an embodiment, the method comprises providing a metal strip, mounting one or more semiconductor dies on the metal strip such that the one or more semiconductor dies are in a flip chip arrangement whereby terminals of the one or more semiconductor dies face the upper surface of the metal strip, forming an electrically insulating encapsulant material on the upper surface of the metal strip that encapsulates the one or more semiconductor dies, and forming package terminals that are electrically connected with the terminals of the one or more semiconductor dies, wherein the package terminals are formed from the metal strip or from metal that is deposited after removing the metal strip.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes

FIG. 2, which includes

FIG. 3, which includes FIGS. 3A-3D, illustrates selected method steps for forming package terminals in a method of forming a semiconductor package, according to another embodiment.

FIG. 4, which includes FIGS. 4A-4D, illustrates selected method steps for forming package terminals in a method of forming a semiconductor package, according to another embodiment.

FIG. 5, which includes FIGS. 5A-5C, illustrates selected method steps in a method of forming a plurality of semiconductor packages, according to an embodiment.

DETAILED DESCRIPTION

Embodiments of a method of forming a semiconductor package using a metal strip are disclosed herein. According to the method, one or more semiconductor dies are mounted on the metal strip in a flip chip arrangement whereby terminals of the semiconductor die or dies face the upper surface of the metal strip. The semiconductor die or dies are encapsulated by an electrically insulating encapsulant material with the metal strip intact. Subsequently, package terminals are formed that are electrically connected to the terminals of the semiconductor die or dies. The package terminals can be formed according to different techniques. According to one technique, the package terminals are formed from the metal strip itself. According to another technique, the metal strip is completely removed and the package terminals are subsequently formed by depositing metal that is electrically connected to the terminals. In either technique, the package size can be advantageously reduced and the package terminals can be have advantageously short and hence low-parasitic electrical connections. The method may be used in a batch process whereby multiple semiconductor packages are formed simultaneously from a single continuous metal strip. In this case, the metal strip may comprise alignment features that are used to position each semiconductor die within a predetermined die attach side. The various process steps including encapsulation, removal of the metal strip, and formation of the package terminals can be performed for each die attach site in parallel. A singulation step can be subsequently performed to separate one or the die attach sites into individual semiconductor packages.

Figure 1A:
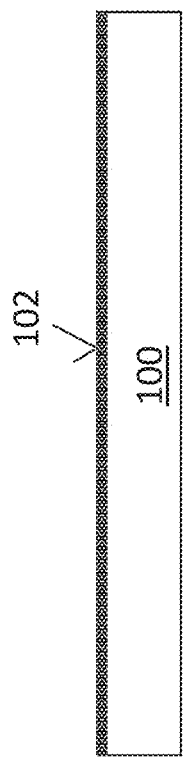
FIGS. 1A-1J, illustrates selected method steps in a method of forming a semiconductor package, according to an embodiment.

Referring to FIG. 1A, a metal strip 100 is provided. The metal strip 100 may comprise an electrically conductive metal, such as Cu, Al, Ni, Ag, Au, Pd, Pt, and alloys thereof. According to an embodiment, the metal strip 100 is formed from Cu or Cu alloy. The metal strip 100 can have a unform thickness. For example, the metal strip 100 can be provided from a metal sheet that is used to form a metal lead frame. An upper surface 102 of the metal strip 100 may be roughened and/or comprise pores that extend into the metal strip 100. For example, the upper surface 102 may be treated by a so-called or micro-etching or micro-etching 2 (ME-2) treatment process to create a roughened and porous surface of the metal strip 100. The roughened and/or porous upper surface 102 enhances adhesion with solder material and facilitates a secure bond with the flip-chip mounted semiconductor die 104 during the solder reflow step to be described below.

Figure 1B:
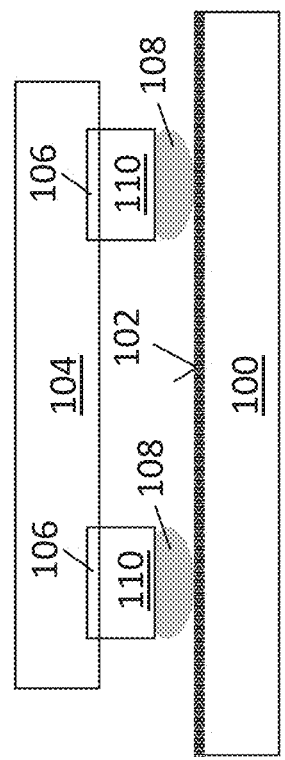

Referring to FIG. 1B, a semiconductor die 104 is arranged on the metal strip 100. The semiconductor die 104 can have any of a wide variety of device configurations, e.g., discrete power device, integrated circuit, logic device, passive device, etc. The semiconductor die 104 is arranged in a flip chip arrangement whereby terminals 106 of the semiconductor die 104 face the upper surface 102 of the metal strip 100. The terminals 106 of the semiconductor die 104 may correspond to I/O terminals, control terminals (e.g., gate), load terminals (e.g., source, drain, collector, emitter, etc.), sense terminals, etc. Solder regions 108 are provided between the terminals 106 of the semiconductor die 104 and the upper surface 102 of the metal strip 100. The solder regions 108 may comprise a lead-free and/or a eutectic solder comprising Sn, Pb, In, Ag, Cu, etc. In an embodiment, the solder regions 108 correspond to solder balls that are provided on the terminals 106 of the semiconductor die 104 before the flip-chip mounting. In another embodiment, the solder regions 108 may be initially formed on the upper surface 102 of the metal strip 100, e.g., by printing or other deposition techniques, and the semiconductor die 104 is mounted such that the terminals 106 of the semiconductor die 104 align with these pre-formed solder regions 108. The method may optionally comprise providing conductive pillars 110 between the terminals 106 of the semiconductor die 104 and the solder regions 108. For example, the conductive pillars 110 can be provided on the terminals 106 of the semiconductor die 104 along with the solder regions 108 that are implemented as solder balls before the flip-chip mounting. The conductive pillars 110 may comprise a metal such as copper, gold, aluminum, nickel, etc. and alloys thereof. In another embodiment, metal stud bumps, e.g., Cu stud bumps, may be used instead of the conductive pillars 110.

Figure 1C:
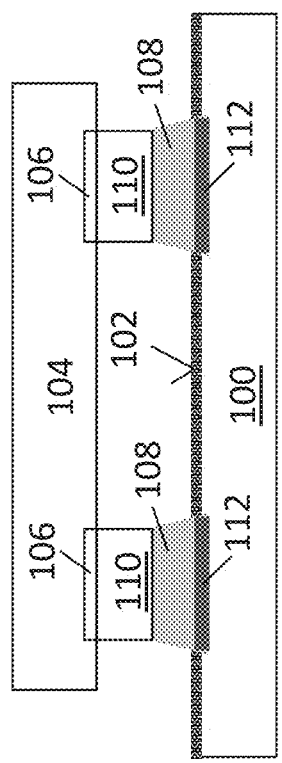

Referring to FIG. 1C, the mounting of the semiconductor die 104 comprises performing a soldering process that forms soldered joints between the semiconductor die 104 and the metal strip 100. The soldering process comprises elevating the temperature of the assembly to a reflow temperature of the solder material that causes the solder regions 108 to melt and form metallurgical bonds with the upper surface 102 of the metal strip 100. As a result, mechanically stable soldered joints are formed. The soldering step may form intermetallic regions 112 at an interface between the solder regions 108 and the upper surface 102 of the metal strip 100. The intermetallic regions 112 comprise intermetallic phases formed by the combination of materials from the solder regions 108 and the metal strip 100. For example, in an embodiment wherein the solder regions 108 comprise an Sn-based solder material and the metal strip 100 is a Cu structure, the soldering step may form intermetallic phases of CuSn. These intermetallic phases of CuSn have different crystallographic properties and a higher melting point than alloyed CuSn or metallic Cu and metallic Sn.

Figure 1D:
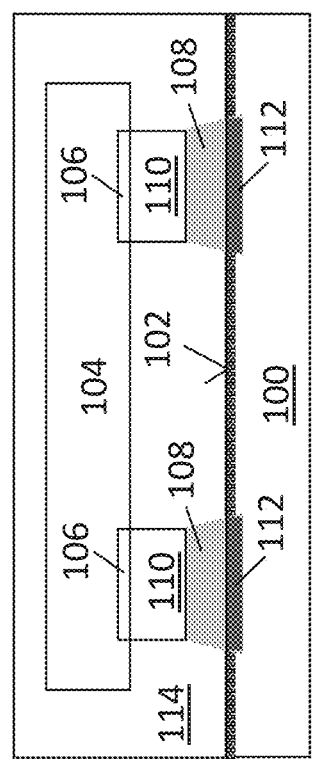

Referring to FIG. 1D, the method comprises forming an electrically insulating encapsulant material 114 on the upper surface 102 of the metal strip 100 that encapsulates the semiconductor die 104. According to an embodiment, the electrically insulating encapsulant material 114 is formed by a molding process, such as injection molding, transfer molding, compression molding, etc. The electrically insulating encapsulant material 114 can include a wide variety of electrically insulating materials that are suitable for semiconductor packaging. Examples of these materials include mold compound, epoxy, thermosetting plastic, polymer, resin, fiber and glass woven fiber materials, etc. According to an embodiment, the electrically insulating encapsulant material 114 comprises a plateable mold compound. Plateable mold compound refers to a type of encapsulation material that includes electrically conductive particles in a dielectric base material, e.g., an epoxy resin. These electrically conductive particles can be used as seed particles in a metal plating process, such as electroplating or electroless plating, to deposit metal directly on the mold compound. A more particular example of a plateable mold compound is a laser-activatable mold compound. A laser-activatable mold compound refers to a mold compound that includes metal particles, e.g., Cu, Ni, Ag, etc. that are released by a focused laser beam applied to the mold compound to create an active metal at the surface of the mold compound for a subsequent metal plating process, such as electroplating or electroless plating. In addition to the additive metal ions, a laser-activatable mold compound includes a polymer material as a base material. Examples of these polymers include thermoset polymers having a resin base, ABS (acrylonitrile butadiene styrene), PC/ABS (polycarbonate/acrylonitrile butadiene styrene), PC (polycarbonate), PA/PPA (polyimide/polyphthalamide), PBT (polybutylene terephthalate), COP (cyclic olefin polymer), PPE (polyphenyl ether), LCP (liquid-crystal polymer), PEI (polyethylenimine or polyaziridine), PEEK (polyether ether ketone), PPS (polyphenylene sulfide), etc.

Figure 1E:
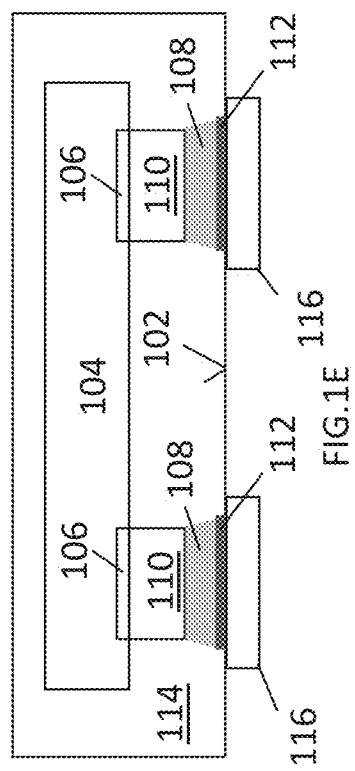
Figure 1F:
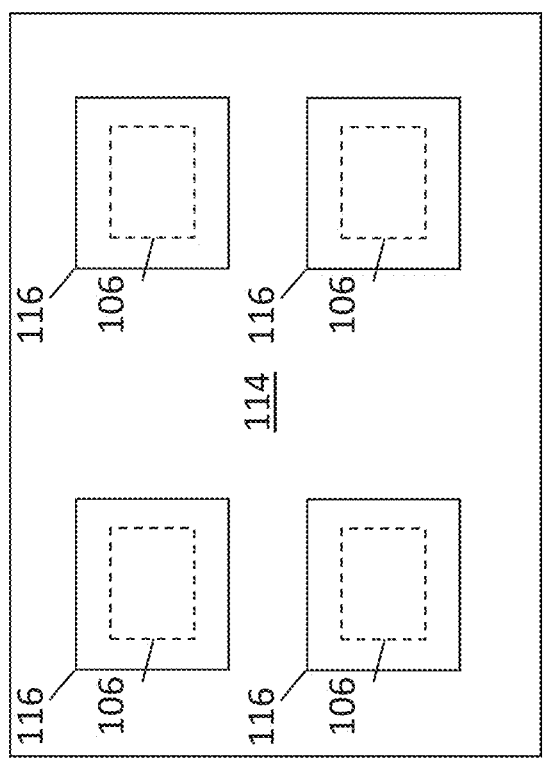

Referring to FIGS. 1E and 1F, package terminals 116 are formed at the lower side of the electrically insulating encapsulant material 114. FIG. 1E shows a cross-sectional view of the package and FIG. 1F shows a plan-view of the semiconductor package from above the lower side of the encapsulant body 114, i.e., the main terminal side of the package. The package terminals 116 are metal structures that are electrically connected with the terminals 106 of the semiconductor die 104. In the depicted embodiment, the package terminals 116 are metal pad structures that directly contact the exposed intermetallic regions 112, which in turn form a direct electrical connection to the terminals 106 of the semiconductor die 104. Thus, the intermetallic regions 112 form part of the electrical connection between the package terminals 116 and the terminals 106 from the semiconductor die 104. In other embodiments, the intermetallic regions 112 can be removed.

The package terminals 116 can be formed in a variety of different ways. According to an embodiment, the package terminals 116 are formed from the metal strip 100. That is, the metal pad structures created from sections of the metal strip 100 itself. These sections of the metal strip 100 can be formed by selectively removing parts of the metal strip 100. According to another embodiment, the metal pad structures that form the package terminals 116 are provided from metal that is deposited after removing the metal strip 100. For example, the metal strip 100 can be completely removed, e.g., by etching, grinding, polishing, etc., and the metal pad structures can be formed by a metal deposition process, such as electroplating or electroless plating, wherein the exposed intermetallic regions 112 provide the seed for the metal deposition process.

Figure 1G:
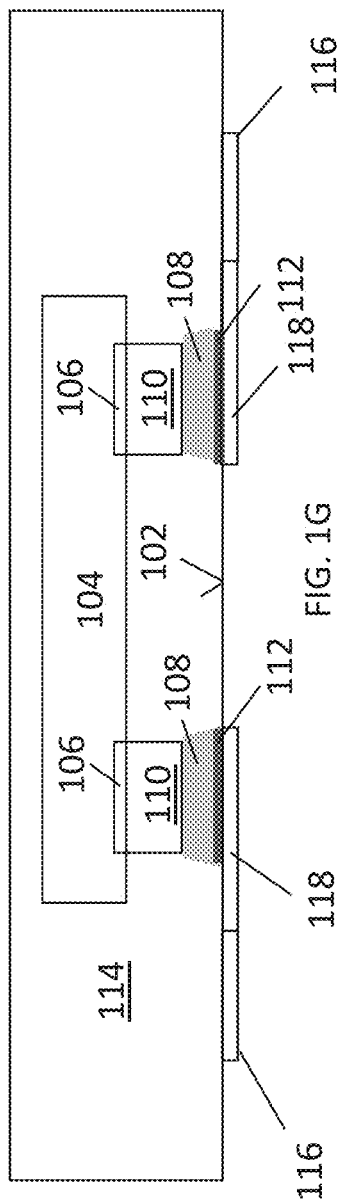
Figure 1H:
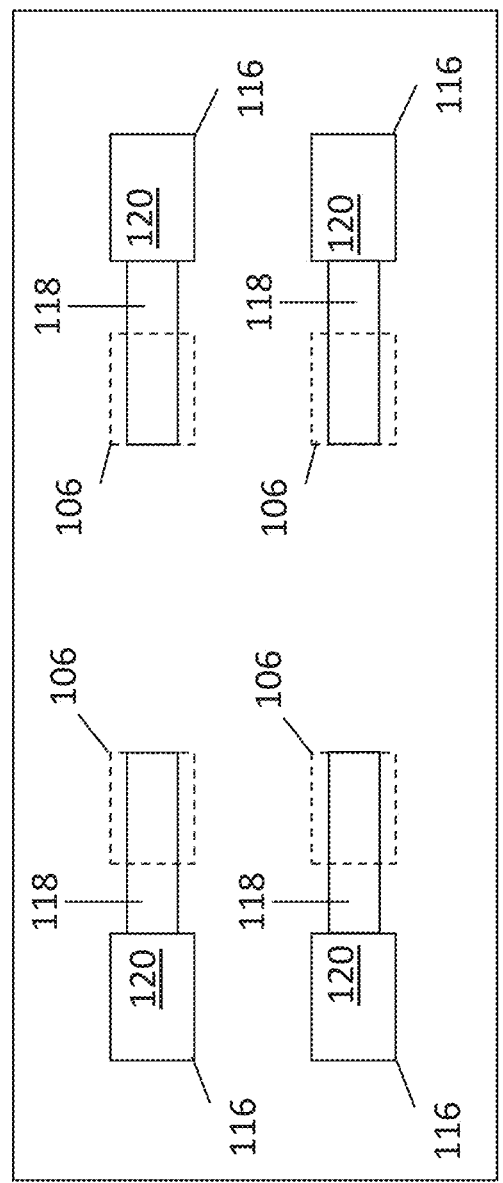

Referring to FIGS. 1G and 1H, an alternate method for forming the package terminals 116 is shown. FIG. 1G shows a cross-sectional view of the package and FIG. 1H shows a plan-view of the semiconductor package from above the lower side of the encapsulant body 114, i.e., the main terminal side of the package. In this embodiment, the package terminals 116 are formed by metal pads 120 that are laterally offset and non-overlapping or partially overlapping with the terminals 106 of the semiconductor die 106. This arrangement may be preferable to provide a greater pad size for the package terminals 116 and/or to provide greater creepage and clearance distance for the package terminals. In this embodiment, the metal strip 100 may be completely removed and the package terminals 116 may be formed by metal that is deposited after removing the metal strip 100. The method may comprise forming conductive tracks 118 in the lower side of the electrically insulating encapsulant material 114 that electrically connect the metal pads 120 with the terminals 106 of the semiconductor die 104. The metal pads 120 and the conductive tracks 118 can be formed by performing one or more metal plating processes, e.g., electroless plating and/or electroplating, after completely removing the metal strip 100. In an embodiment, the electrically insulating encapsulant material 114 comprises a plateable mold compound that is used to deposit metal on the lower side of the electrically insulating encapsulant material 114, thereby forming the metal pads 120 and the conductive tracks 118. For example, the insulating encapsulant material 114 may be a laser-activatable mold compound, and a laser direct structuring technique may be performed by applying a laser to release metal particles from the mold compound, followed by metal plating process or processes, e.g., electroless plating and/or electroplating, to deposit metal in a laser defined area. In other embodiments, the metal pads 120 and the conductive tracks 118 can be formed by a laser assisted metal deposition technique whereby a metal powder is applied to the electrically insulating encapsulant material 114 and a laser beam is used to fuse the metal power together into a metal region at the focal point of the laser beam, or an ink jet metal printing process whereby a viscous ink comprising a liquid solvent and a conductive metal, e.g., Ag, Cu, etc., is applied by a printer head in the desired location and subsequently dried. The metal pads 120 and the conductive tracks 118 can be formed by the same metal plating process, but this is not necessarily required.

Figure 1I:
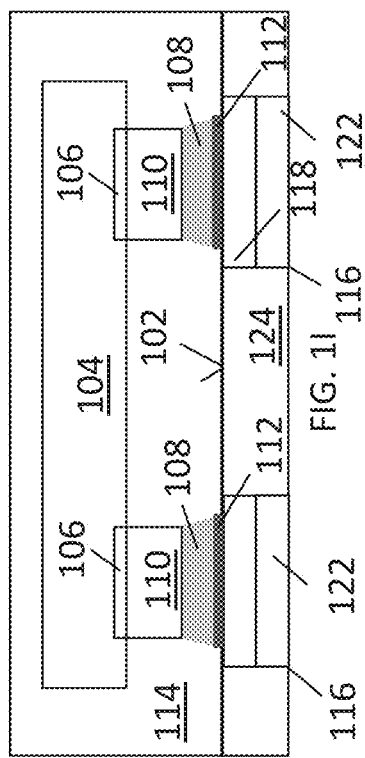
Figure 1J:
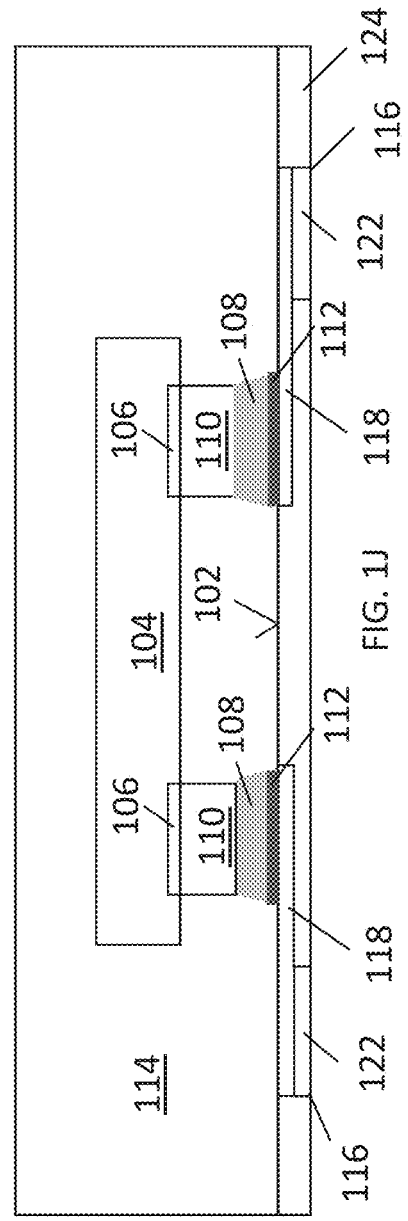

Referring to FIGS. 1I and 1J, further processing steps may be performed to the semiconductor package. FIG. 1I illustrates these steps being performed to a package with the package terminals formed according to the method of FIGS. 1E and 1F. FIG. 1J illustrates these steps being performed to a package with the package terminals formed according to the method of FIGS. 1G and 1H. These further processing steps comprise forming a solderable metal layer 122 as an outer surface part of the package terminals 116. The solderable metal layer 122 comprises a metal that can form a soldered joint with a metal surface. For instance, the solderable metal layer 122 may comprise solder material alloys comprising, e.g., Sn, Pb, Ag, Cu, Mn, Bi, etc. In one particular example, the solderable metal layer 122 is formed by a metal plating technique. More particularly, the solderable metal layer 122 is an electroplated layer of so-called EniG (Electroless nickel immersion gold) and Sn, which forms a tin-alloy solder. Further, an electroless plating process may be performed to form the conductive tracks 118 and seed layer of the metal pads 120. Generally speaking, the thickness of the conductive tracks 118 may be between 500 nm and 70 μm. In low power applications, the thickness of the conductive tracks 118 may be between 500 nm and 15 μm. In high power applications, the thickness of the conductive tracks 118 may be between 50 μm and 70 μm.

Figure 2A:
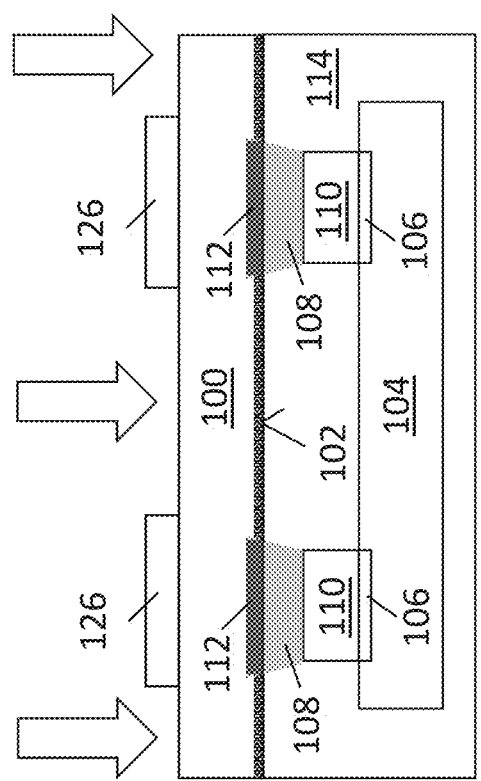
FIGS. 2A-2B, illustrates selected method steps for forming package terminals in a method of forming a semiconductor package, according to an embodiment.
Figure 2B:
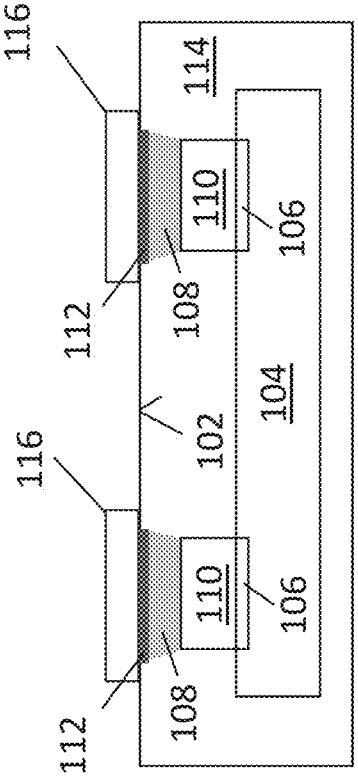

Referring to FIG. 2, an embodiment of the method wherein the package terminals 116 are formed from the metal strip 100 is shown. As shown in FIG. 2A, after forming the electrically insulating encapsulant material 114 on the upper surface 102 of the metal strip 100, an etch mask 126 is formed at a lower side of the metal strip 100. The assembly comprising the metal strip 100 and the electrically insulating encapsulant material 114 may be arranged on a temporary carrier (not shown). An etchant, such as a chemical etchant, is applied to the lower side of the metal strip 100 thereby removing regions of the metal strip exposed from the etch mask 126, thereby creating structured parts of the metal strip 100. As shown in FIG. 2B, the structured parts of the metal strip 100 that remain after the masked etching form the package terminals 116 that are electrically connected to the terminals 106 of the semiconductor die 104. In this case, the intermetallic regions 112 form part of the electrical connection between the package terminals 116 and the terminals the semiconductor die 104. Additionally, these electrical connections comprise the solder regions 108 and the conductive pillars 110.

Instead of a masked etching technique, the package terminals 116 can be formed from the metal strip 100 itself in other ways. For example, a laser structuring process may be performed to selectively remove parts of the metal strip 100. A mechanical grinding or milling may be performed prior to the laser structuring process to reduce a thickness of the metal strip 100.

Referring to FIG. 3, an embodiment of the method wherein the package terminals 116 are formed from metal that is deposited after removing the metal strip 100 is shown. As shown in FIGS. 3A and 3B, the metal strip 100 is completely removed to expose the complete lower side of the electrically insulating encapsulant material 114. This can be done according to a variety of techniques. Examples of these techniques include any one or combination of: chemical etching, mechanical grinding, milling, or lasering. As shown in FIGS. 3C and 3D, a laser direct structuring process is performed. In this case, the electrically insulating encapsulant material 114 comprises a laser activatable mold compound. The laser direct structuring process comprises activating regions of the laser activatable mold compound with laser energy 128. Subsequently, a metal deposition process is performed to form the package terminals 116 in the manner described above.

Figure 4C:
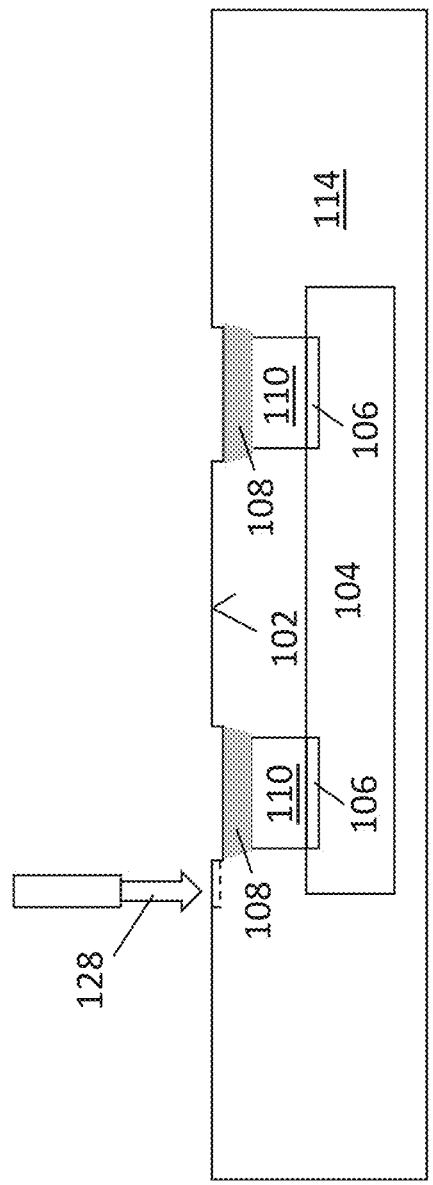
Figure 4D:
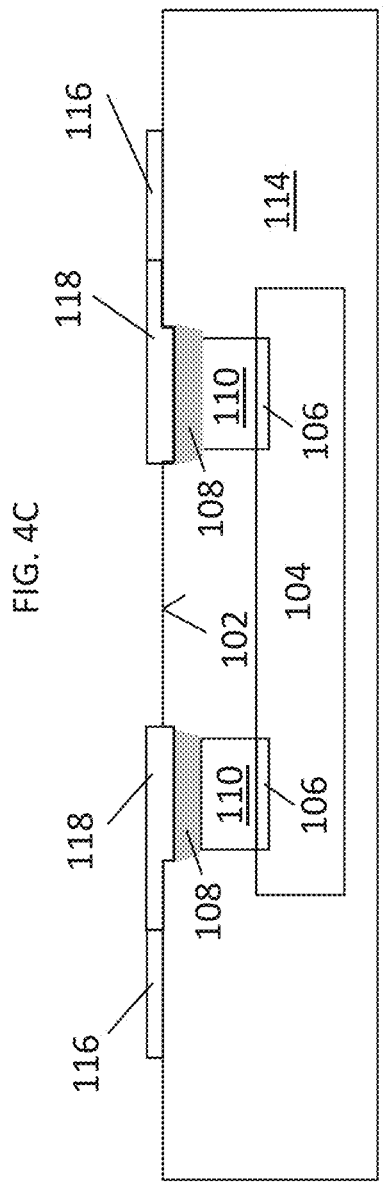

Referring to FIG. 4, another embodiment of the method wherein the package terminals 116 are formed from metal that is deposited after removing the metal strip 100 is shown. The embodiment of FIG. 4 differs from the embodiment of FIG. 3 in that the intermetallic regions 112 do not form part of the electrical connection between the package terminals 116 and the terminals 106 from the semiconductor die 104. As shown in FIG. 4B, after the metal strip 100 is removed, the intermetallic regions 112 that are exposed from the metal strip 100 are removed. This may be done using a chemical solvent, for example. As shown in FIGS. 4C and 4D, a similar laser direct structuring process as described above may be performed. In this case, the plating process deposits metal directly on the solder regions 110 that are devoid or substantially devoid of the intermetallic phases.

The embodiment of FIG. 4 may be preferred to improve the performance of the device, as the intermetallic regions 112 generally increase the electrical resistance of the connections. The embodiment of FIG. 3 may be preferred because it requires less processing steps and thus lower expense.

Referring to FIG. 5, a batch processing technique for forming a plurality of the semiconductor packages is shown. This batch processing technique can be used in combination with any of the techniques described with reference to FIGS. 1-4.

Referring to FIG. 5A, the metal strip 100 may comprise alignment features 130. The alignment features 130 are geometric disruptions in the upper surface 102 of the metal strip 100 that are recognizable by semiconductor processing tools, such as visible light or infrared inspection tools. Embodiments of the alignment features 130 include perforations in the metal strip 100, i.e., complete openings, depressions that extend into the upper surface 102 of the metal strip 100, and protrusions that extend upward from the upper surface 102 of the metal strip 100. In the depicted embodiment, the alignment features 130 have a rounded geometry. Other shapes, e.g., rectangles, ovals, polygons, etc., are possible configurations for the alignment features 130. As shown, the metal strip 100 comprises a first row 132 of the alignment features 130 that runs alongside a first outer edge side of the metal strip 100. The metal strip 100 may additionally comprise a second row 134 of the alignment features 130 that runs alongside a second outer edge side of the metal strip 100. The alignment features 130 may be arranged at regular spacings from one another and/or at fixed distances from the outer edge sides of the metal strip 100. In this way, the alignment features 130 provide reference points from which semiconductor processing tools can use the alignment features 130 to ascertain a location on the metal strip 100. The depicted arrangement illustrates just one potential pattern of the alignment features 130 that may be used for the mounting of semiconductor dies 104 on the metal strip 100. In general, any arrangement of the alignment features 130 that allows for semiconductor processing tools to recognize the alignment features 130 and place a semiconductor die 104 at a particular location on the upper surface 102 of the metal strip 100 is possible. Generally speaking, it is preferable for the alignment features 130 to be formed in a peripheral region of the metal strip 100 that is as close to the outer edges of the metal strip 100 as possible, while still being recognizable by semiconductor processing tools. In this way, the available area on the upper surface 102 of the metal strip 100 for the mounting of semiconductor dies 104 is maximized.

Referring to FIG. 5B, the alignment features 130 may be used to generate a map 136 of die attach sites 138 that defines a unique location for each of the die attach sites 138 based on a distance to the alignment features 130. The map 136 can be created by equipment that is part of or connected to the semiconductor processing tools that perform the die mounting process. For example, the map 136 can be created by and stored in the memory of a die mounting tool or computer that is operatively connected with the die mounting tool. Each die attach site 138 may have a geometry that is sufficient to accommodate the mounting of one of the semiconductor dies 104 thereon along with sufficient margin around the semiconductor die 104 to perform processing steps such as singulation and terminal formation. Each of the die attach sites 138 are positionally referenced to the alignment features 130. That is, the equipment defines the boundaries of the die attach site 138 based on their relative distance to one or more of the alignment features 130. A triangulation technique may be used with multiple ones of the alignment features 130 to provide precise distances.

According to an embodiment, the map 136 of die attach sites 138 comprises a grid of rows and columns. That is, the die attach sites 138 are plotted to align the die attach sites 138 with one another in two perpendicular directions. Each one of the die attach sites 138 is disposed within the grid at a unique row and column address. Using the map 136 of die attach sites 138 shown in FIG. 5B as an example, the die attach site 138 at the upper right corner may have a row and column address of (1,1), the die attach site 138 immediately below this die attach site 138 may have a row and column address of (1,2), and so forth. The columns can be aligned with the first row 132 and/or with the second row 134 of the alignment features 130 and consequently with the outer edge sides of the metal strip 100.

Figure 5C:
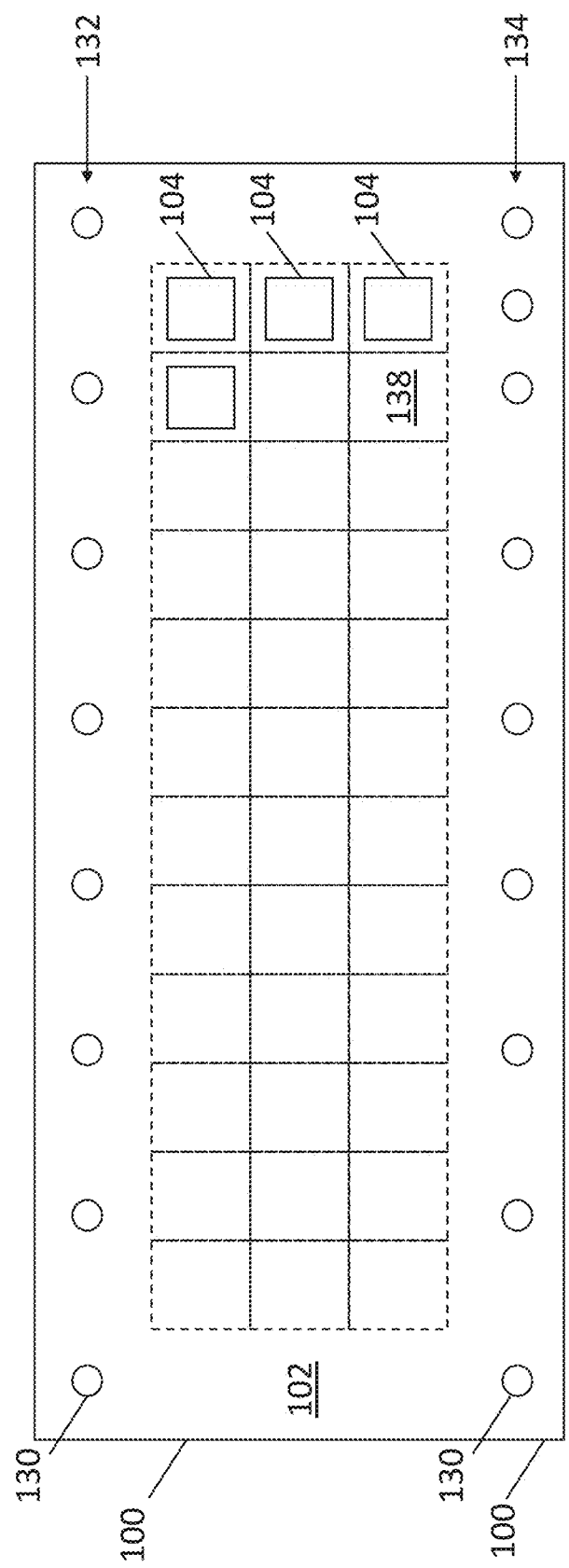

Referring to FIG. 5C, a plurality of the of the semiconductor dies 104 are mounted on the metal strip 100. Each of the semiconductor dies 104 in the plurality are arranged in a flip chip arrangement whereby terminals of the respective semiconductor dies 104 from the plurality face the upper surface 102 of the metal strip 100, e.g., as shown and described with reference to FIG. 1B. The mounting of the semiconductor dies 104 comprises using the alignment features 130 to position each one of the semiconductor dies 104 from the plurality on the upper surface 102 of the metal strip 100. More particularly, the mounting process comprises positioning each one of the semiconductor dies 104 from the plurality within a different one of attach sites 138 from the map 136 of die attach sites 138. That is, one of the semiconductor dies 104 is mounted to be within one of the die attach sites 138. FIG. 5C shows this process after four of the semiconductor dies 104 have been placed. This process may be continued until the map 136 of die attach sites 138 is fully populated with one semiconductor die 104 placed within each die attach site 138.

After placing the semiconductor dies 104 using the alignment features 130, the solder reflow step may be performed. Subsequently, the encapsulant material 114 can be formed to cover each of the semiconductor dies 104 on the metal strip 100. Subsequently, the package terminals 116 may be performed and the electrically insulating layer 124 may be formed. After completing these steps, the assembly can be simulated cut the metal strip 100 and the encapsulant material 114 into individual package sites. This may comprise a mechanical sawing or laser cutting process, for example. Single die semiconductor packages may be formed by singulating each die attach site 138. Alternatively, multi-die semiconductor packages may be formed by singulating a group of the die attach sites 138. Each semiconductor package formed by the batch processing technique may be identical. However, this is not necessary. In other embodiments, the semiconductor packages that are formed from a single metal strip 100 may differ from one another with respect to semiconductor die configuration, terminal configuration, number of dies, etc.

Although the present disclosure is not so limited, the following numbered examples demonstrate one or more aspects of the disclosure.

Example 1. A method of forming one or more semiconductor packages, the method comprising: providing a metal strip; mounting one or more semiconductor dies on the metal strip such that the one or more semiconductor dies are in a flip chip arrangement whereby terminals of the one or more semiconductor dies face the upper surface of the metal strip; forming an electrically insulating encapsulant material on the upper surface of the metal strip that encapsulates the one or more semiconductor dies; forming package terminals that are electrically connected with the terminals of the one or more semiconductor dies, wherein the package terminals are formed from the metal strip or from metal that is deposited after removing the metal strip.

Example 2. The method of example 1, wherein the package terminals are formed from the metal strip.

Example 3. The method of example 1, wherein the package terminals are formed by performing a masked etching of the metal strip, and wherein the package terminals are formed from structured parts of the metal strip that remain after the masked etching.

Example 4. The method of example 1, wherein the package terminals are formed from metal that is deposited after removing the metal strip.

Example 5. The method of example 4, wherein the electrically insulating encapsulant material comprises a plateable mold compound, and wherein performing the one or more metal deposition processes comprises using the plateable mold compound to deposit metal on the lower side of the electrically insulating encapsulant material.

Example 6. The method of example 5, wherein the electrically insulating encapsulant material comprises a laser activatable mold compound, wherein using the plateable mold compound to deposit metal on the lower side of the electrically insulating encapsulant material comprises activating regions of the laser activatable mold compound with laser energy and depositing the metal on the activated regions of the laser activatable mold compound.

Example 7. The method of example 5, wherein the package terminals are formed from metal pads that are laterally offset from the terminals from one of the semiconductor dies, wherein the method further comprises forming conductive tracks in the lower side of the electrically insulating encapsulant material that electrically connect the metal pads and the terminals from one of the semiconductor dies, and wherein the metal pads and the conductive tracks are formed by the one or more plating processes.

Example 8. The method of example 1, wherein mounting the one or more semiconductor dies comprises providing solder regions between the terminals of the one or more semiconductor dies and the upper surface of the metal strip and performing a solder process that reflows the solder regions, and wherein the solder process forms intermetallic regions at an interface between the solder regions and the upper surface of the metal strip.

Example 9. The method of example 9, wherein the intermetallic regions form part of the electrical connection between the package terminals and the terminals from one of the semiconductor dies.

Example 10. The method of example 8, wherein the method comprises removing the metal strip to expose the intermetallic regions and removing the intermetallic regions after removing the metal strip such that the intermetallic regions do not form part of the electrical connection between the package terminals and the terminals from one of the semiconductor dies.

Example 11. The method of example 12, further comprising depositing metal directly on the solder regions after removing the intermetallic regions, wherein the deposited metal forms the package terminals or conductive tracks that form part of the electrical connection between the package terminals and the terminals from one of the semiconductor dies.

Example 12. The method of example 1, wherein mounting the one or more semiconductor dies comprises mounting a plurality of the semiconductor dies on the metal strip such that each one of the semiconductor dies from the plurality are in the flip chip arrangement.

Example 13. The method of example 12, wherein the metal strip comprises alignment features, and wherein mounting the one or more semiconductor dies comprises using the alignment features to position each one of the semiconductor dies from the plurality on the upper surface of the metal strip.

Example 14. The method of example 13, wherein using the alignment features to position each one of the semiconductor dies from the plurality on the upper surface of the metal strip comprises generating a map of die attach sites that defines a unique location for each of the die attach sites based on a distance to the alignment features.

The term "electrically connected" as used herein describes a permanent low-ohmic, i.e., low-resistance, connection between electrically connected elements. An electrical connection includes a direct contact between the concerned elements and a connection by low-resistance and non-rectifying electrically conductive elements.

The semiconductor package described herein may comprise one or more semiconductor dies with a variety of different configurations. These semiconductor dies may be singulated from a semiconductor wafer (not shown), e.g., by sawing, prior to being mounting on the metal baseplate. In general, the semiconductor wafer and therefore the resulting semiconductor die may be made of any semiconductor material suitable for manufacturing a semiconductor device. Examples of such materials include, but are not limited to, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), etc. In general, the semiconductor die can be any active or passive electronic component. Examples of these devices include power semiconductor devices, such as power MISFETs (Metal Insulator Semiconductor Field Effect Transistors) power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), power bipolar transistors or power diodes such as, e.g., PIN diodes or Schottky diodes, etc. Other examples of these devices include logic devices, such as microcontrollers, e.g., memory circuits, level shifters, etc. One or more of the semiconductor dies can be configured as a so-called lateral device. In this configuration, the terminals of the semiconductor die are provided on a single main surface and the semiconductor die is configured to conduct in a direction that is parallel to the main surface of the semiconductor die 104. Alternatively, one or more of the semiconductor dies can be configured as a so-called vertical device. In this configuration, the terminals of the semiconductor die are provided on opposite facing main and rear surfaces and the semiconductor die is configured to conduct in a direction that is perpendicular to the main surface of the semiconductor die.

Spatially relative terms such as "under," "below," "lower," "over," "upper," "main", "rear", and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming one or more semiconductor packages, the method comprising:
providing a metal strip;

mounting one or more semiconductor dies on the metal strip such that the one or more semiconductor dies are in a flip chip arrangement whereby terminals of the one or more semiconductor dies face the upper surface of the metal strip;

forming an electrically insulating encapsulant material on the upper surface of the metal strip that encapsulates the one or more semiconductor dies; and forming package terminals that are electrically connected with the terminals of the one or more semiconductor dies, wherein the package terminals are formed from metal that is deposited after removing the metal strip, and wherein the electrically insulating encapsulant material comprises a plateable mold compound, and wherein performing the one or more metal deposition processes comprises using the plateable mold compound to deposit metal on the lower side of the electrically insulating encapsulant material.

2. The method of claim 1, wherein the electrically insulating encapsulant material comprises a laser activatable mold compound, wherein using the plateable mold compound to deposit metal on the lower side of the electrically insulating encapsulant material comprises activating regions of the laser activatable mold compound with laser energy and depositing the metal on the activated regions of the laser activatable mold compound.

3. The method of claim 1, wherein the package terminals are formed from metal pads that are laterally offset from the terminals from one of the semiconductor dies, wherein the method further comprises forming conductive tracks in the lower side of the electrically insulating encapsulant material that electrically connect the metal pads and the terminals from one of the semiconductor dies, and wherein the metal pads and the conductive tracks are formed by the one or more plating processes.

4. The method of claim 1, wherein mounting the one or more semiconductor dies comprises providing solder regions between the terminals of the one or more semiconductor dies and the upper surface of the metal strip and performing a solder process that reflows the solder regions, and wherein the solder process forms intermetallic regions at an interface between the solder regions and the upper surface of the metal strip.

5. The method of claim 4, wherein the intermetallic regions form part of the electrical connection between the package terminals and the terminals from one of the semiconductor dies.

6. The method of claim 4, wherein the method comprises removing the metal strip to expose the intermetallic regions and removing the intermetallic regions after removing the metal strip such that the intermetallic regions do not form part of the electrical connection between the package terminals and the terminals from one of the semiconductor dies.

7. The method of claim 6, further comprising depositing metal directly on the solder regions after removing the intermetallic regions, wherein the deposited metal forms the package terminals or conductive tracks that form part of the electrical connection between the package terminals and the terminals from one of the semiconductor dies.

8. The method of claim 1, wherein mounting the one or more semiconductor dies comprises mounting a plurality of the semiconductor dies on the metal strip such that each one of the semiconductor dies from the plurality are in the flip chip arrangement.

9. The method of claim 8, wherein the metal strip comprises alignment features, and wherein mounting the one or more semiconductor dies comprises using the alignment features to position each one of the semiconductor dies from the plurality on the upper surface of the metal strip.

10. The method of claim 9, wherein using the alignment features to position each one of the semiconductor dies from the plurality on the upper surface of the metal strip comprises generating a map of die attach sites that defines a unique location for each of the die attach sites based on a distance to the alignment features.

11. A method of forming one or more semiconductor packages, the method comprising:

providing a metal strip;

mounting one or more semiconductor dies on the metal strip such that the one or more semiconductor dies are in a flip chip arrangement whereby terminals of the one or more semiconductor dies face the upper surface of the metal strip;

forming an electrically insulating encapsulant material on the upper surface of the metal strip that encapsulates the one or more semiconductor dies; and forming package terminals that are electrically connected with the terminals of the one or more semiconductor dies, wherein the package terminals are formed from the metal strip, wherein mounting the one or more semiconductor dies comprises providing solder regions between the terminals of the one or more semiconductor dies and the upper surface of the metal strip and performing a solder process that reflows the solder regions, and wherein the solder process forms intermetallic regions at an interface between the solder regions and the upper surface of the metal strip, wherein the package terminals are formed by performing a masked etching of the metal strip, and wherein the package terminals are formed from structured parts of the metal strip that remain after the masked etching.

* * * * *